(12) United States Patent
Doyle et al.

(10) Patent No.: US 10,580,973 B2
(45) Date of Patent: *Mar. 3, 2020

(54) SPIN-TRANSFER TORQUE MEMORY (STTM) DEVICES HAVING MAGNETIC CONTACTS

(71) Applicant: INTEL CORPORATION, Santa Clara, CA (US)

(72) Inventors: Brian S. Doyle, Portland, OR (US); Kaan Oguz, Hillsboro, OR (US); Charles C. Kuo, Hillsboro, OR (US); Mark L. Doczy, Portland, OR (US); Satyarth Suri, Hillsboro, OR (US); David L. Kencke, Beaverton, OR (US); Robert S. Chau, Beaverton, OR (US); Roksana Golizadeh Mojarad, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/214,306

(22) Filed: Dec. 10, 2018

(65) Prior Publication Data

US 2019/0109281 A1 Apr. 11, 2019

Related U.S. Application Data

(63) Continuation of application No. 15/126,682, filed as application No. PCT/US2014/045606 on Jul. 7, 2014, now Pat. No. 10,158,065.

(51) Int. Cl.
*H01L 43/02* (2006.01)
*H01L 43/08* (2006.01)
(Continued)

(52) U.S. Cl.
CPC ............ *H01L 43/08* (2013.01); *G11C 11/161* (2013.01); *H01L 27/222* (2013.01); *H01L 43/12* (2013.01); *G11C 2213/52* (2013.01)

(58) Field of Classification Search
None
See application file for complete search history.

(56) References Cited

U.S. PATENT DOCUMENTS 6,233,172 B1 5/2001 Chen et al.
6,898,112 B2 5/2005 Janesky et al.
(Continued)

FOREIGN PATENT DOCUMENTS

JP 2003031869 A 1/2003
JP 2005109263 A 4/2005
(Continued)

OTHER PUBLICATIONS

International Search Report and Written Opinion as received for Patent Application No. PCT/US2014/045606, dated Feb. 25, 2015, 12 pages.
(Continued)

*Primary Examiner* — Benjamin P Sandvik
(74) *Attorney, Agent, or Firm* — Finch & Maloney PLLC

(57) ABSTRACT

Techniques are disclosed for forming integrated circuit structures including a magnetic tunnel junction (MTJ), such as spin-transfer torque memory (STTM) devices, having magnetic contacts. The techniques include incorporating an additional magnetic layer (e.g., a layer that is similar or identical to that of the magnetic contact layer) such that the additional magnetic layer is coupled antiferromagnetically (or in a substantially antiparallel manner). The additional magnetic layer can help balance the magnetic field of the magnetic contact layer to limit parasitic fringing fields that would otherwise be caused by the magnetic contact layer.
(Continued)

The additional magnetic layer may be antiferromagnetically coupled to the magnetic contact layer by, for example, including a nonmagnetic spacer layer between the two magnetic layers, thereby creating a synthetic antiferromagnet (SAF). The techniques can benefit, for example, magnetic contacts having magnetic directions that are substantially in-line or substantially in-plane with the layers of the MTJ stack.

20 Claims, 13 Drawing Sheets

(51) Int. Cl.
  *H01L 27/22* (2006.01)
  *H01L 43/12* (2006.01)
  *G11C 11/16* (2006.01)

(56) References Cited

U.S. PATENT DOCUMENTS

| | | | |
|---|---|---|---|
| 7,573,736 B2 | 8/2009 | Wang et al. | |
| 8,981,503 B2 | 3/2015 | Beach et al. | |
| 10,158,065 B2* | 12/2018 | Doyle | G11C 11/161 |
| 2005/0099724 A1 | 5/2005 | Nakamura et al. | |
| 2005/0247964 A1 | 11/2005 | Pietambaram et al. | |
| 2006/0017081 A1 | 1/2006 | Sun et al. | |
| 2006/0039185 A1 | 2/2006 | Braun et al. | |
| 2007/0086121 A1 | 4/2007 | Nagase | |
| 2009/0303779 A1 | 12/2009 | Chen et al. | |
| 2011/0149646 A1 | 6/2011 | Liu et al. | |
| 2012/0063218 A1 | 3/2012 | Huai et al. | |
| 2012/0205759 A1 | 8/2012 | Hu | |
| 2012/0306034 A1 | 12/2012 | Meng et al. | |
| 2013/0134533 A1 | 5/2013 | Zhu et al. | |
| 2013/0161768 A1 | 6/2013 | Khvalkovskiy et al. | |
| 2014/0177326 A1 | 6/2014 | Doyle et al. | |
| 2014/0374904 A1 | 12/2014 | Matsumoto et al. | |
| 2015/0052302 A1* | 2/2015 | Dong | H01L 43/08 711/118 |
| 2017/0092846 A1 | 3/2017 | Doyle et al. | |
| 2019/0088854 A1* | 3/2019 | Ito | H01L 43/02 |

FOREIGN PATENT DOCUMENTS

| | | |
|---|---|---|
| JP | 2005327781 A | 11/2005 |
| JP | 2007142364 A | 6/2007 |
| JP | 2013187350 A | 9/2013 |
| WO | 2016007126 A1 | 1/2016 |

OTHER PUBLICATIONS

International Preliminary Report on Patentability as received for Patent Application No. PCT/US2014/045606, dated Jan. 10, 2017. 8 pages.
Taiwan Office Action received for Taiwan Application No. 104117640. Office Action dated Apr. 28, 2017. 6 pages including English translation.
Extended European Search Report received for EP Application No. 14897086.6, dated Jan. 30, 2018. 10 pages.
JP Office Action received for JP Application No. 2016-570050. Date of office Action dated Mar. 16, 2018. 7 pages.
U.S. Appl. No. 15/126,682, filed Sep. 16, 2016, Patented.
PCT/US2014/045606, filed Jul. 7, 2014, Published.

* cited by examiner

SPIN-TRANSFER TORQUE MEMORY (STTM) DEVICES HAVING MAGNETIC CONTACTS

RELATED APPLICATIONS

This application is a Continuation Application of U.S. patent application Ser. No. 15/126,682, filed on Sep. 16, 2016, which is a U.S. National Stage Entry of PCT Application No. PCT/US2014/045606, filed on Jul. 7, 2014. Each of these applications is herein incorporated by reference in its entirety.

BACKGROUND

Spin-transfer torque memory (STTM) devices, such as spin-transfer torque random-access memory (STT-RAM) devices, use spin-based memory technology and include magnetic tunnel junctions (MTJs) that can store at least one bit of information. Typically, an MTJ has a fixed magnetic layer and a free magnetic layer, and the direction of magnetization in the free layer determines whether the MTJ is in a high resistivity state or a low resistivity state (e.g., whether it is storing a 1 or a 0). In this manner, STTM is a non-volatile type of memory. The current needed to switch the magnetic direction of the free layer of the MTJ (e.g., during a write cycle) is referred to as the critical current.

DETAILED DESCRIPTION

Techniques are disclosed for forming integrated circuit structures including a magnetic tunnel junction (MTJ), such as spin-transfer torque memory (STTM) devices, having magnetic contacts. The techniques include incorporating an additional magnetic layer (e.g., a layer that is similar or identical to that of the magnetic contact layer) such that the additional magnetic layer is coupled antiferromagnetically (or in a substantially antiparallel manner). The additional magnetic layer can help balance the magnetic field of the magnetic contact layer to limit parasitic fringing fields that would otherwise be caused by the magnetic contact layer. The additional magnetic layer may be antiferromagnetically coupled to the magnetic contact layer by, for example, including a nonmagnetic spacer layer between the two magnetic layers, thereby creating a synthetic antiferromagnet (SAF). The techniques can benefit, for example, magnetic contacts having magnetic directions that are substantially in-line or substantially in-plane with the layers of the MTJ stack. Numerous configurations and variations will be apparent in light of this disclosure.

General Overview

Figure 1A:
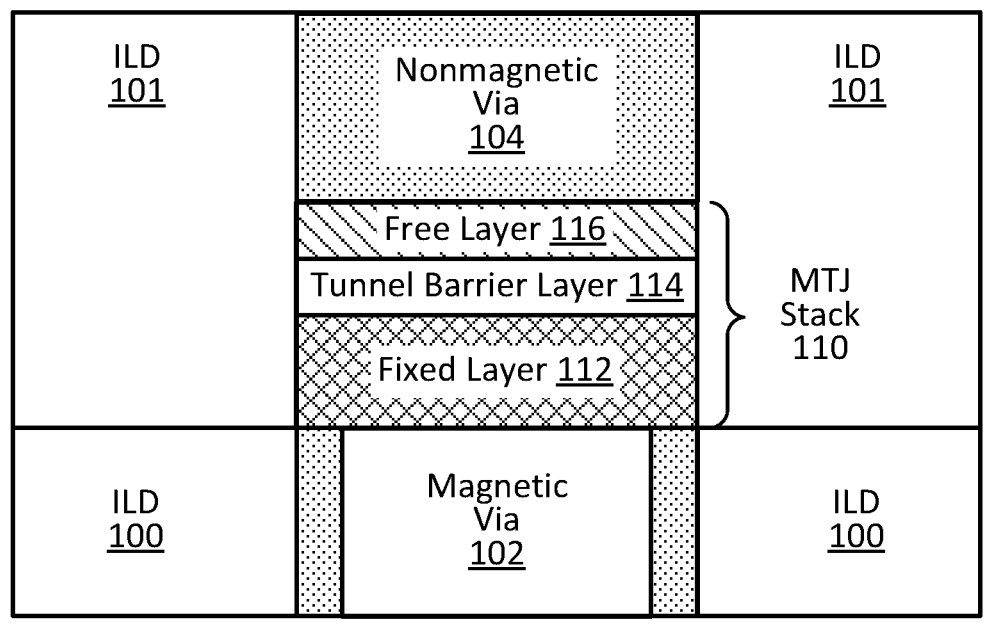
FIG. 1A illustrates an example spin-transfer torque memory (STTM) device including a magnetic contact/via and a nonmagnetic contact/via.
Figure 1B:
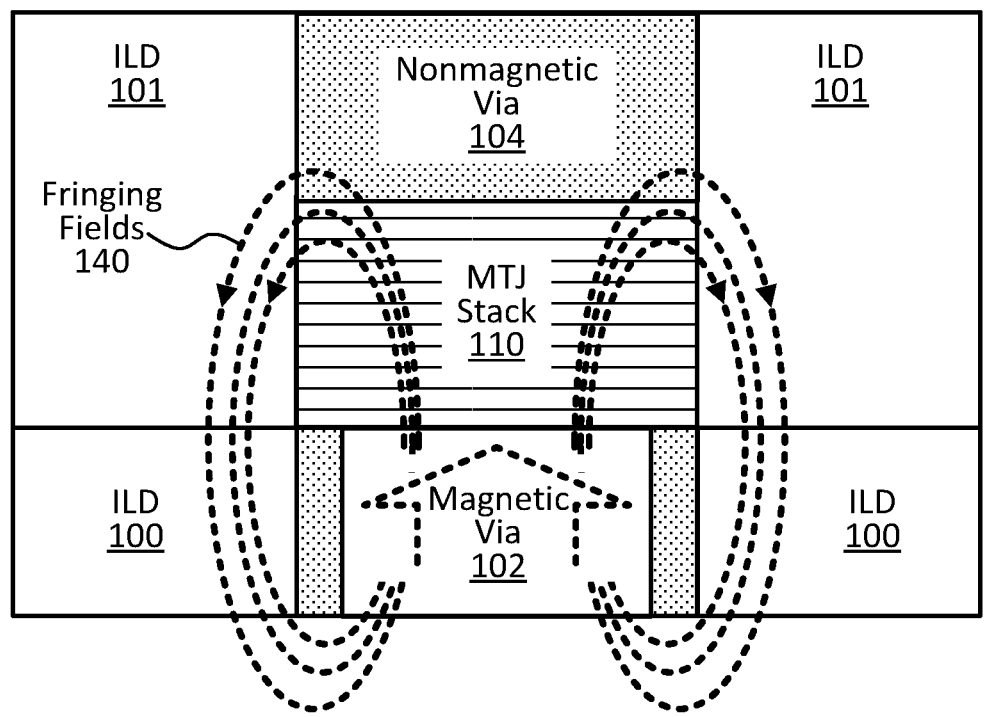
FIG. 1B illustrates the fringing fields that are caused by the magnetic contact/via of FIG. 1A.

The use of magnetic contacts to a magnetic tunnel junction (MTJ) in, for example, spin-transfer torque memory (STTM), presents non-trivial issues. FIG. 1A illustrates an example STTM device including a magnetic contact/via and a nonmagnetic contact/via. As can be seen, the STTM device includes MTJ stack 110 that is comprised of fixed magnetic layer 112 and free magnetic layer 116, and tunnel barrier layer 114 disposed therebetween. MTJ stack 110 is electrically connected to magnetic via 102 and nonmagnetic via 104, and thereby, vias 102 and 104 are contacts for MTJ stack 110. In addition, the structure is enclosed by inter-layer dielectric (ILD) 100, 101 as shown. FIG. 1B illustrates the fringing fields that are caused by the magnetic contact/via of FIG. 1A. The magnetic moment of magnetic via 102 and related fringing/stray magnetic fields 140 are indicated by arrows. As can be seen, fringing fields 140 enter MTJ stack 110, which can cause undesired issues. Such issues may include, for example, interfering with the magnetic direction of the free layer 116 of MTJ stack 110, causing it to a) become weaker and switch more easily (e.g., when opposite to the direction of the magnetic via 102), or b) become stronger and harder to switch (e.g., when parallel to the direction of magnetic via 102). Further, in some instances, the fringing fields 140 of magnetic via 102 may make switching free layer 116 so easy that simply the act of reading the STTM device may cause an undesired switch of free layer 116. Other example issues may include that fringing fields 140 can change the critical current needed to switch the device and can also change the resistance ratio of the high and low resistivity states (e.g., whether it is storing a 1 or a 0). Other example issues may include that fringing fields 140 may interfere with neighboring components, such as other MTJ stacks in neighboring STTM devices.

Thus, and in accordance with one or more embodiments of the present disclosure, techniques are disclosed for forming STTM devices having magnetic contacts. As will be apparent in light of the present disclosure, in some embodiments, the issues described above that accompany using magnetic contacts/vias for STTM devices (or for other devices that include an MTJ) can be limited by incorporating another magnetic layer that is inserted so that the additional magnetic layer is coupled antiferromagnetically or coupled in a substantially antiparallel manner (e.g., where the magnetic moments of the magnetic layers are substantially antiparallel). In this manner, the magnetic field from the additional magnetic layer can balance or nearly balance the magnetic field of the magnetic contact layer, thus limiting the parasitic fringing fields of the magnetic contact layer. In some embodiments, the two magnetic layers may be separated by a spacer layer (e.g., a ruthenium (Ru) layer) that facilitates the antiferromagnetic coupling of the two magnetic layers. In some embodiments, the magnetic layers (e.g., ferromagnetic layers), and the spacer layer disposed therebetween, create a synthetic antiferromagnet (SAF).

In some embodiments, only one contact to the MTJ may be magnetic (and include an additional magnetic layer antiferromagnetically coupled thereto), while in other embodiments, both contacts to the MTJ may be magnetic (with each magnetic contact including a corresponding additional magnetic layer antiferromagnetically coupled thereto). Although a perfect antiferromagnetic coupling would be preferred for reducing the parasitic fringing fields caused by the magnetic field of the magnetic contacts, the antiferromagnetic coupling with the corresponding additional magnetic layers need not be perfect. In other words, the magnetic layers being coupled need not be coupled such that the magnetic moments of the magnetic layers are exactly antiparallel (or exactly balanced). In some embodiments, benefits may be realized by coupling a magnetic contact layer with an additional magnetic layer such that the magnetic moments of the magnetic layers are substantially antiparallel (e.g., within 15 degrees of exactly antiparallel). In some embodiments, the STTM device may be configured such that the magnetic moments of two coupled magnetic layers are substantially in-line (e.g., substantially directed toward one another or substantially directed away from one another). In some embodiments, the STTM device may be configured such that the magnetic moments of two coupled magnetic layers are substantially in-plane (e.g., directed away from one another in two substantially parallel planes).

Upon analysis (e.g., using scanning/transmission electron microscopy (SEM/TEM) and/or composition mapping), a structure configured in accordance with one or more embodiments will effectively show an integrated circuit structure including an MTJ (e.g., an STTM device) having at least one magnetic contact and an additional magnetic layer coupled thereto, as variously described herein. For example, in some embodiments, the magnetic contact may be antiferromagnetically coupled with the additional magnetic layer (e.g., to create an SAF), while in some embodiments, the magnetic moment of the magnetic contact layer may be substantially antiparallel (or substantially balanced) to the magnetic moment of the additional magnetic layer. In some embodiments, antiferromagnetically coupling the magnetic layers (or coupling them in a substantially antiparallel manner) may help limit the parasitic fringing fields from negatively affecting the MTJ of the device to which they are a part of and/or from negatively affecting neighboring devices. Numerous configurations and variations will be apparent in light of this disclosure.

Architecture and Methodology

Figure 2:
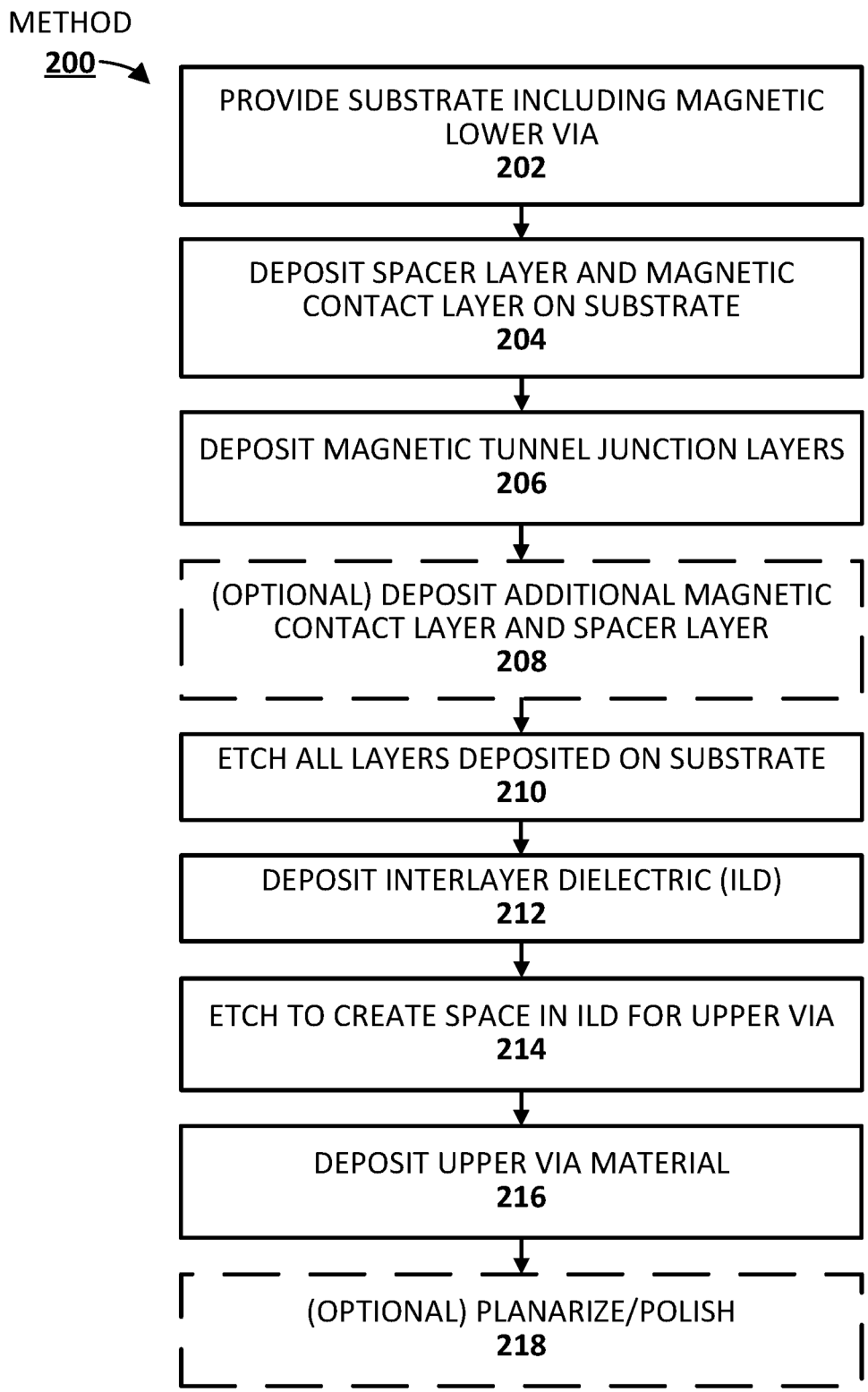
FIG. 2 illustrates a method of forming an STTM device having at least one magnetic contact, in accordance with one or more embodiments of the present disclosure.

FIG. 2 illustrates a method 200 of forming a spin-transfer torque memory (STTM) device having at least one magnetic contact, in accordance with one or more embodiments of the present disclosure. As will be apparent in light of this disclosure, each magnetic contact includes a corresponding magnetic via layer, and the magnetic layers are separated by a spacer layer that antiferromagnetically couples the magnetic layers or couples them in a substantially antiparallel manner. FIGS. 3A-3I illustrate example structures that are formed when carrying out method 200 of FIG. 2, in accordance with various embodiments. Although the structures and techniques disclosed herein are primarily illustrated and described in the context of STTM devices, similar principles and techniques as variously described herein may be used for other integrated circuit structures. For example, the techniques described herein may be used for other structures including a magnetic tunnel junction (MTJ), such as magnetoresistive random-access memory (MRAM) or thermal assisted switching MRAM (TAS-MRAM). In other words, the techniques described herein can be used in any suitable structure or device that would benefit from the use of one or more SAF contacts to, for example, help reduce or eliminate the effects from fringing fields that are associated with the use of magnetic contacts.

Figure 3A:
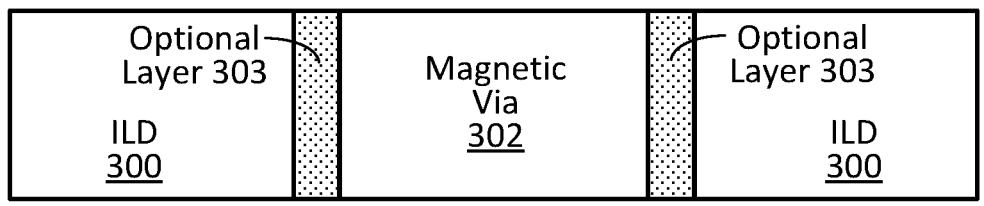
FIGS. 3A-3I illustrate example structures that are formed when carrying out the method of FIG. 2, in accordance with various embodiments.

As can be seen in FIG. 2, method 200 includes providing 202 a substrate including a lower magnetic via, such as the substrate shown in FIG. 3A, in accordance with an embodiment. FIG. 3A shows an example substrate upon which an STTM device having SAF contacts can be formed. In this example embodiment, the substrate includes a first (or lower) magnetic via 302, having interlayer dielectric (ILD) 300 on either side of the magnetic via 302. Magnetic via 302 may be or may extend to an interconnect leading to, for example, a bit line, as will be apparent in light of this disclosure. Magnetic via 302 can be formed of any suitable electrically conductive magnetic material (or combination of materials), using any suitable technique, and the dimensions of magnetic via 302 (e.g., thickness, depth etc.) can be customized as desired for a given target application or end use. For example, in some cases, magnetic via 302 may be comprised of one or more ferromagnetic materials, such as iron (Fe), cobalt (Co), and/or (Ni). In some cases, magnetic via 302 may comprise manganese (Mn), CoFeB, or any other suitable magnetic material. In some embodiments, magnetic via 302 may be electrically grounded or electrically connected to a voltage source (e.g., a transistor or diode). In some such embodiments, whether magnetic via 302 is electrically grounded or electrically connected to a voltage source may depend on the orientation of the subsequently deposited MTJ stack, as will be apparent in light of this disclosure. In addition, magnetic via 302 may be electrically connected to a bit line or a word line, depending upon the orientation of the MTJ stack (e.g., whether the stack is formed with the free magnetic layer on the bottom or on the top of the stack). ILD 300 can be formed from any suitable dielectric or insulator material (or combination of such materials), using any suitable technique. For example, in some cases, dielectric 300 may comprise an oxide such as silicon dioxide ($SiO_2$) or carbon doped oxide (CDO), silicon nitride, organic polymers such as perfluorocyclobutane or polytetrafluoroethylene, fluorosilicate glass (FSG), and/or organosilicates such as silsesquioxane, siloxane, or organosilicate glass.

As can also be seen in FIG. 3A, magnetic via 302 includes optional layer 303 on either side in this example case, with optional layer 303 located between magnetic via 302 and ILD 300. Optional layer 303 (and the other optional layer described herein) may be present to help the magnetic material (of the magnetic vias and/or magnetic contacts as variously described herein) to not diffuse into the surrounding ILD material; however, in some embodiments, optional layer may not be included on either side of any of the magnetic layers. Optional layer 303 may comprise a non-magnetic cladding layer, such as titanium nitride (TiN), tantalum (Ta), or some other suitable material. In some instances, optional layer 303 may be a barrier layer to, for example, help provide magnetic shielding for corresponding adjacent magnetic layer (e.g., magnetic via 302, in this example case). Optional layer 303 may have a thickness (e.g., the dimension between magnetic via 302 and ILD 300) ranging from 1 to 15 nm, or some other suitable thickness depending on the given target application or end use.

Figure 3B:
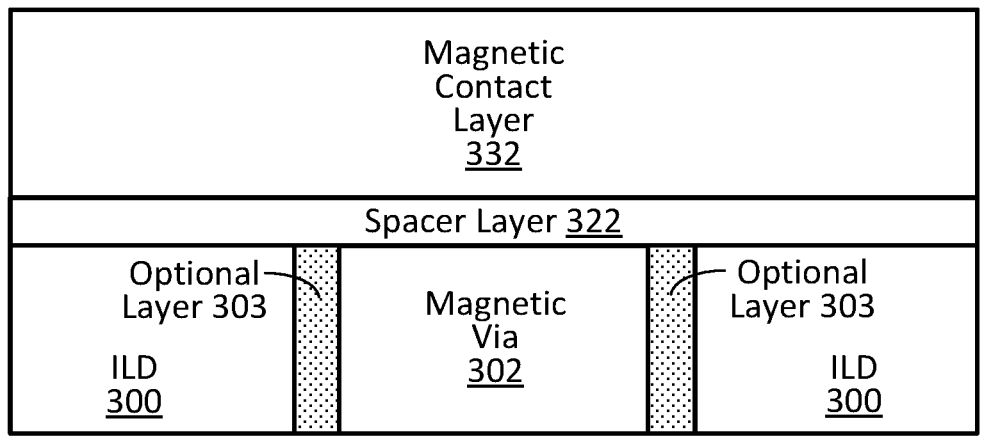

Method 200 continues with depositing 204 spacer layer 322 and magnetic contact layer 332 on the substrate shown in FIG. 3A to form the example structure shown in FIG. 3B, in accordance with an embodiment. Deposition 204 of spacer layer 322 and magnetic contact layer 332 may be performed using any suitable processes or techniques. For example, deposition 204 may be performed using a physical vapor deposition (PVD) process (such as sputter deposition), a chemical vapor deposition (CVD) process, an atomic layer deposition (ALD) process, and/or a molecular beam epitaxy (MBE) process. Magnetic contact layer 332 eventually becomes a magnetic contact to the MTJ stack of the STTM device, as will be apparent in light of this disclosure. Spacer layer 322 (also referred to as a coupling layer) is an interlayer between magnetic via 302 and magnetic contact layer 332 that allows the two magnetic layers to have substantially antiparallel coupling and/or be antiferromagnetic coupling. Therefore, the specific material and/or dimensions (e.g., thickness, depth, etc.) of spacer layer 322 may be determined by magnetic via 302 and/or magnetic contact layer 332, such that the selected material/thickness of spacer layer 322 allows the two magnetic layers to be antiferromagnetically coupled. For example, spacer layer 322 may comprise at least one of ruthenium (Ru), osmium (Os), rhenium (Re), chromium (Cr), rhodium (Rh), copper (Cu), niobium (Nb), molybdenum (Mo), tungsten (W), iridium (Ir), vanadium (V), and their alloys, and/or any other suitable material depending on the given target application or end use. Spacer layer 322 may also have a thickness in the range of 0.5 and 1.5 nm, or any other suitable thickness depending on the given target application or end use. In an example embodiment, spacer layer 322 comprises/includes ruthenium (Ru) and has a thickness (e.g., the dimension between magnetic via 302 and magnetic contact layer 332, in this example case) between 0.7 and 1.0 nm.

Magnetic contact layer 332 can be comprised of any suitable electrically conductive magnetic material (or combination of materials) and the dimensions of magnetic contact layer 332 (e.g., thickness, depth, etc.) can be customized as desired for a given target application or end use. For example, in some cases, magnetic contact layer 332 may be comprised of one or more ferromagnetic materials, such as iron (Fe), cobalt (Co), and/or nickel (Ni). In some cases, magnetic contact layer 332 may comprise CoFeB, or a Heusler alloy or half-Heusler alloy (such as MnxGa or Co$_2$YZ where Y=Mn, Cr, Fe and Z=Al, Si, Ga) or any other suitable magnetic material(s). As described herein, in some embodiments, magnetic contact 332 can be selected to antiferromagnetically couple with magnetic via 302. In some such embodiments, magnetic contact layer 332 may be identical or similar to magnetic via 302, such that magnetic contact layer 332, spacer layer 322, and magnetic via 302 create a synthetic antiferromagnet (SAF), as discussed herein in more detail with reference to, for example, the embodiment in FIG. 3J.

Figure 3C:
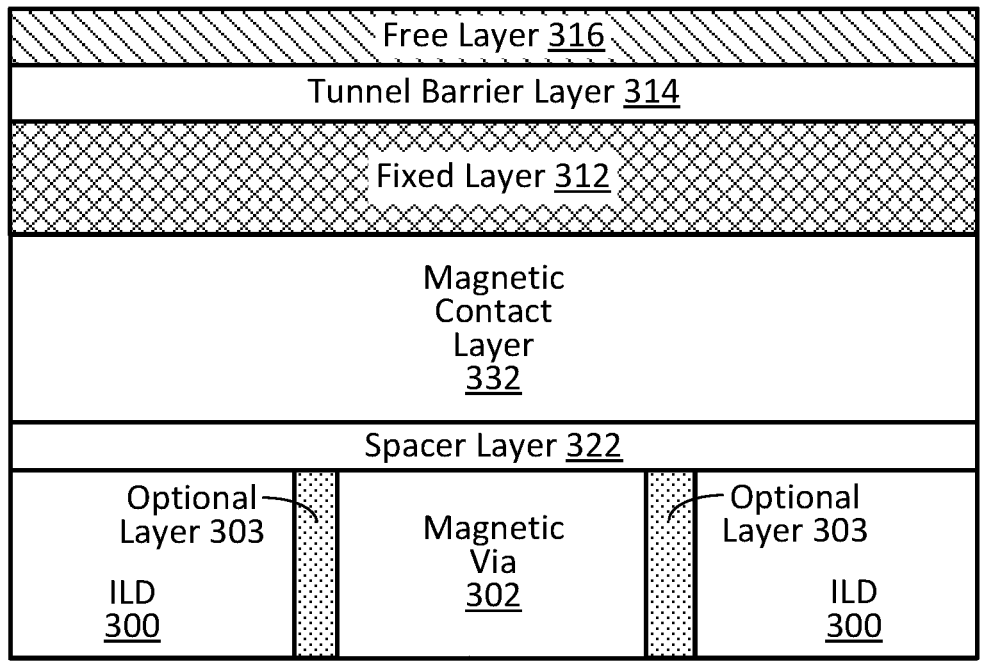

Method 200 continues with depositing 206 magnetic tunnel junction (MTJ) layers, including fixed layer 312, tunnel barrier layer 314, and free layer 316 to form the example structure shown in FIG. 3C, in accordance with an embodiment. Deposition 206 of the MTJ layers 312, 314, and 316 may be performed using the example techniques described herein (e.g., PVD, CVD, ALD, MBE, etc.), or using any other suitable technique. As will be apparent in light of this disclosure, MTJ layers 312, 314, and 316 will be etched to form MTJ stack 310, where tunnel barrier layer 314 is disposed between fixed layer 312 and free layer 316. Although MTJ stack 310 is discussed herein as having only the three layers 312, 314, and 316, MTJ stack may comprise additional layers, such as spacer or barrier layers, additional fixed and/or free magnetic layers, etc. Therefore the MTJ stacks of the present disclosure are not limited to having only a fixed magnetic layer, tunnel barrier layer, and free magnetic layer, but are provided as having such layers for illustrative purposes. For example, in some cases, fixed magnetic layer and/or free magnetic layer may comprise multiple layers that perform the same function as the respective layer. Note that although the MTJ stack is shown as having the free layer above the fixed layer in this example embodiment, the present disclosure need not be so limited, and in other embodiments, the free layer may be formed below the fixed layer (e.g., the position of fixed layer 312 and free layer 316 may be switched, in an example embodiment).

Fixed magnetic layer 312 (also referred to as a pinned magnetic layer) can be formed from any suitable magnetic material (or combination of such materials). In some embodiments, fixed magnetic layer 312 is composed of a material or stack of materials for maintaining a fixed majority spin. For example, in accordance with some embodiments, fixed magnetic layer 312 may be formed from: iron (Fe); tantalum (Ta); ruthenium (Ru); cobalt (Co); an alloy of one or more transition metals, such as cobalt-palladium (CoPd) or cobalt-platinum (CoPt); an alloy of one or more transition metals and a metalloid, such as cobalt-iron-boron (CoFeB); and/or an alloy of any one or more thereof. In some embodiments, fixed magnetic layer 312 is composed of a single CoFeB layer, while in other embodiments fixed layer 312 is composed of a CoFeB/Ru/CoFeB stack, for example. Fixed magnetic layer 312 may have any suitable thickness, such as a thickness in the range of 20-30 nm, for example, in some embodiments. Other suitable materials and thicknesses for fixed layer 312 will depend on a given application and will be apparent in light of this disclosure.

Tunnel barrier layer 314 can formed from any suitable electrically insulating material (or combination of such materials). In some embodiments, tunnel barrier layer 314 is composed of a material suitable for allowing current of a majority spin to pass through the layer, while impeding (at least to some extent) current of a minority spin to pass through the layer, as is customarily the case for tunneling or tunnel barrier layers. For example, in some cases, tunnel barrier layer 314 may be formed from an oxide, such as magnesium oxide (MgO), aluminum oxide (Al$_2$O$_3$), or any other suitable tunnel materials. Tunnel barrier layer 314 may have any suitable thickness, such as a thickness of 1 nm or less, for example, in some embodiments. Other suitable materials and thicknesses for tunnel barrier layer 214 will depend on a given application and will be apparent in light of this disclosure.

Free magnetic layer 316 (also referred to as a memory layer) can be formed from any of the example magnetic materials discussed herein with respect to fixed magnetic layer 312, for example. In some embodiments, free magnetic layer 316 is composed of a material suitable for transitioning between a majority spin and a minority spin, depending on the application. Further, free magnetic layer 316 may be permitted to undergo changes in its magnetization, and thus may be considered, in a general sense, as being a free or dynamic magnetic layer. Thus, free layer 316 may be referred to as a ferromagnetic memory layer, in some instances. In some example cases, free magnetic layer 316 may be formed as a single layer of CoFeB. Free magnetic layer 316 may have any suitable thickness, such as a thickness in the range of 1-2 nm, for example, in some embodiments. Other suitable materials and thicknesses for free magnetic layer 316 will depend on a given application and will be apparent in light of this disclosure.

Figure 3D:
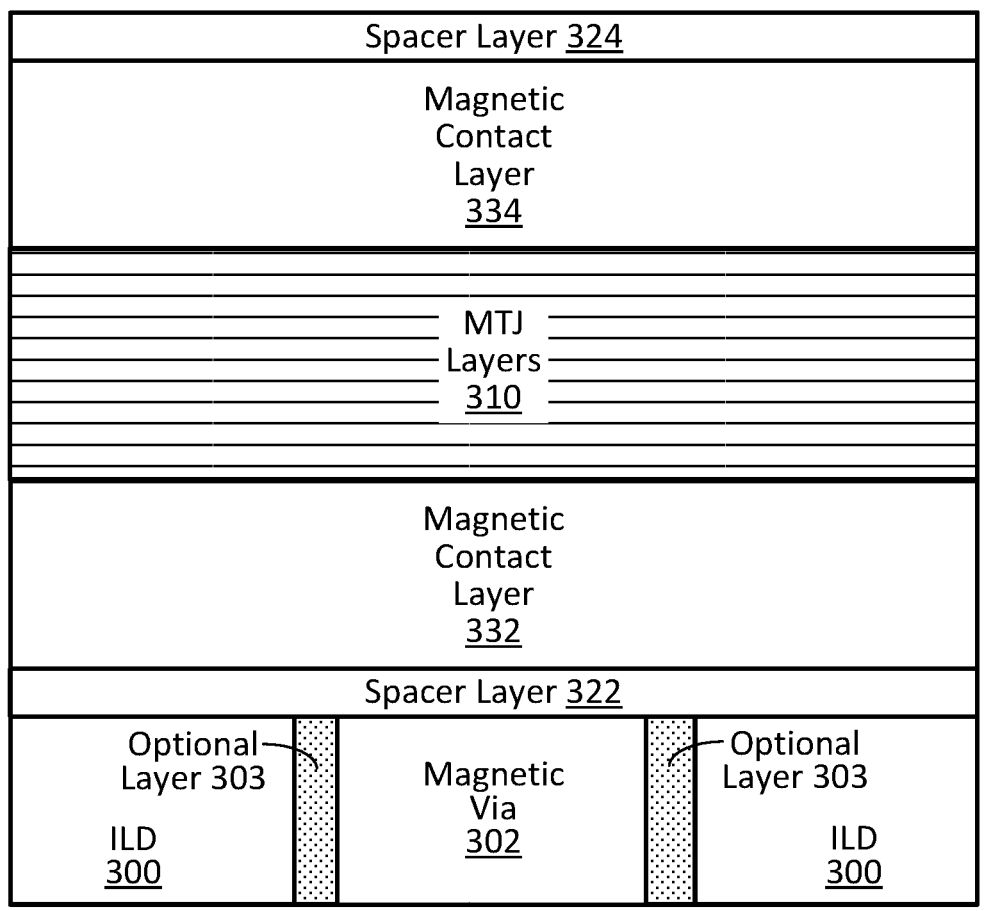

Method 200 continues with depositing 208 additional magnetic contact layer 334 and spacer layer 324 to form the example structure shown in FIG. 3D, in accordance with an embodiment. Deposition 208 of the optional layer 334 and 324 may be performed using the example techniques described herein (e.g., PVD, CVD, ALD, MBE, etc.), or using any other suitable technique. Deposition 208 is optional, because both contacts to MTJ stack 310 need not be SAF contacts, as will be described in more detail herein, such as with reference to the embodiment in FIG. 4. However, in this example embodiment, magnetic contact layer 334 and spacer layer 324 are deposited to later form an additional SAF contact (an upper contact, in this example case. Magnetic contact layer 334 may comprise any suitable magnetic material (or combination of materials), such as the materials discussed herein for magnetic contact layer 332, or any other suitable material(s). Further, the dimensions of magnetic contact layer 334 (e.g., thickness, depth, etc.) can be customized as desired for a given target application or end use, and may have a thickness or thickness range as discussed herein for magnetic contact layer 332, or any other suitable thickness.

As will be apparent in light of this disclosure, spacer layer 324 is an interlayer between magnetic contact layer 334 and magnetic via 304, and spacer layer 324 allows the two magnetic layers to be antiferromagnetically coupled. Therefore, the specific material and/or dimensions (e.g., thickness, depth, etc.) of spacer layer 324 may be determined by magnetic contact layer 334 and/or magnetic via 304, such that the selected material thickness of spacer layer 324 allows the two magnetic layers to have substantially antiparallel coupling and/or be antiferromagnetically coupled. Spacer layer 324 may comprise any suitable material (or combination of materials), such as the materials discussed herein for spacer layer 322, or any other suitable material(s). Further, the dimensions of spacer layer 324 (e.g., thickness, depth, etc.) can be customized as desired for a given target application or end use, and may have a thickness or thickness range as discussed herein for spacer layer 322, or any other suitable thickness. As discussed herein in more detail with reference to, for example, the embodiment in FIG. 3J, magnetic contact 334, spacer layer 324, and magnetic via 304 may be configured to create an SAF contact for MTJ stack 310.

Figure 3E:
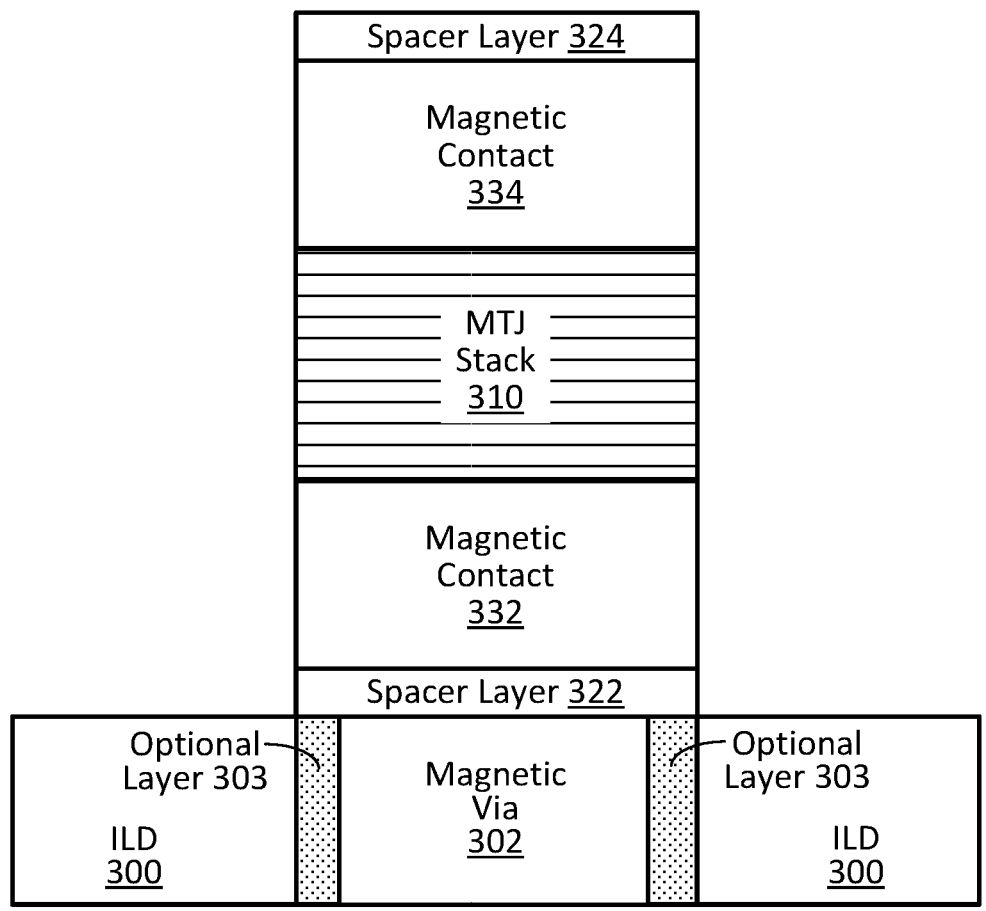

Method 200 continues with etching 210 all of the layers (e.g., layers 322, 332, 312, 314, 316, 334, and 324) deposited on the substrate (e.g., the substrate provided in FIG. 3A) to form the example structure shown in FIG. 3E, in accordance with an embodiment. Etch 210 may be performed using any suitable etching techniques and may include any number of suitable patterning processes. For example, in some embodiments, etch 210 may include any suitable dry or wet etch process. In some embodiments, etch 210 may be performed in-situ/without air break, or they may be performed ex-situ. In some such embodiments, an in-situ etch may be performed to help protect the layers of MTJ stack 210, such as, for example, to help prevent the oxidation of free layer 216. In some embodiments, etch 210 may be performed using etch products that are not volatile, such as using argon and/or krypton ion bombardment.

Figure 3F:
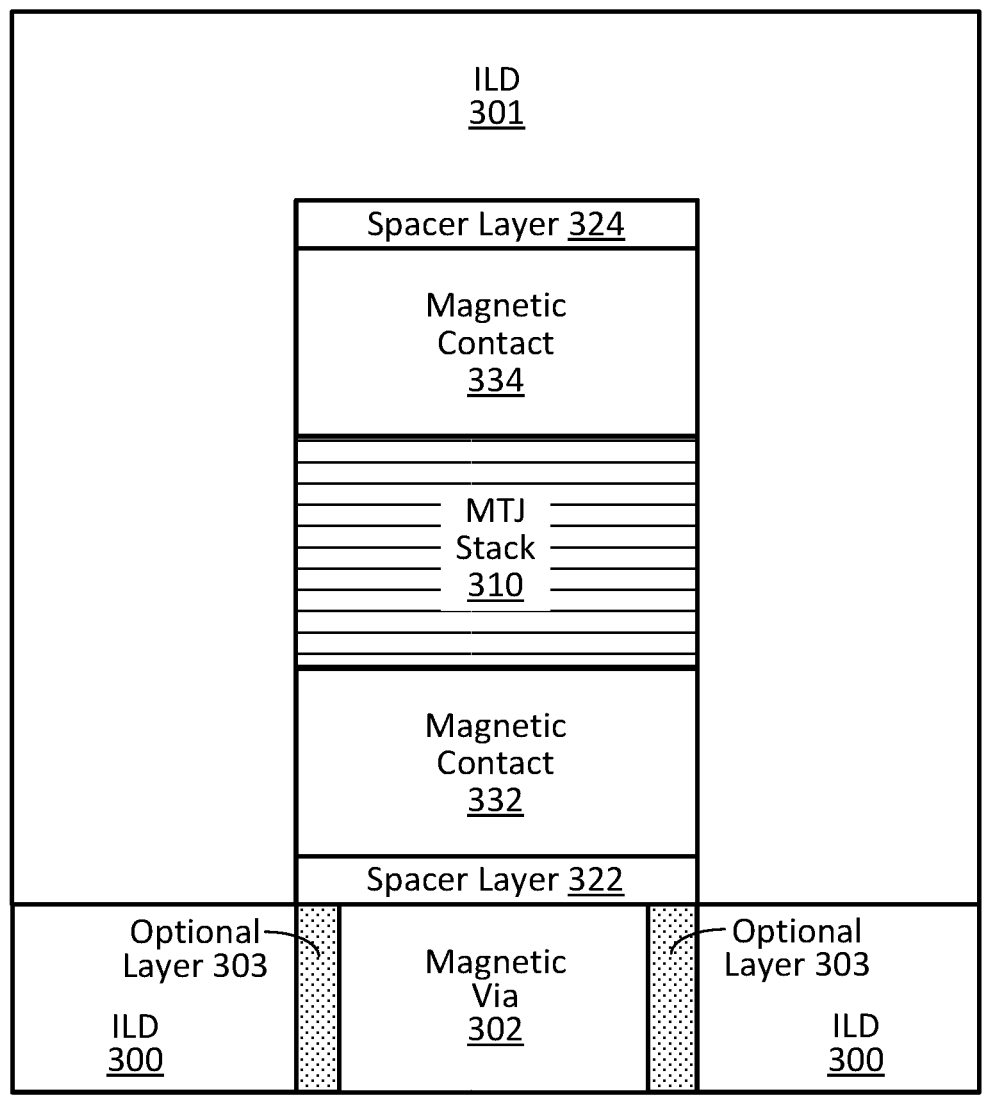

Method 200 continues with depositing 212 interlayer dielectric (ILD) 301 to form the structure shown in FIG. 3F, in accordance with an embodiment. Deposition 212 may be performed using the example techniques described herein (e.g., PVD, CVD, ALD, MBE, etc.), or using any other suitable technique. ILD 301 can be formed from any suitable dielectric or insulator material (or combination of such materials). For example, in some cases, dielectric 301 may comprise an oxide such as silicon dioxide ($SiO_2$) or carbon doped oxide (CDO), silicon nitride, organic polymers such as perfluorocyclobutane or polytetrafluoroethylene, fluorosilicate glass (FSG), and/or organosilicates such as silsesquioxane, siloxane, or organosilicate glass.

Figure 3G:
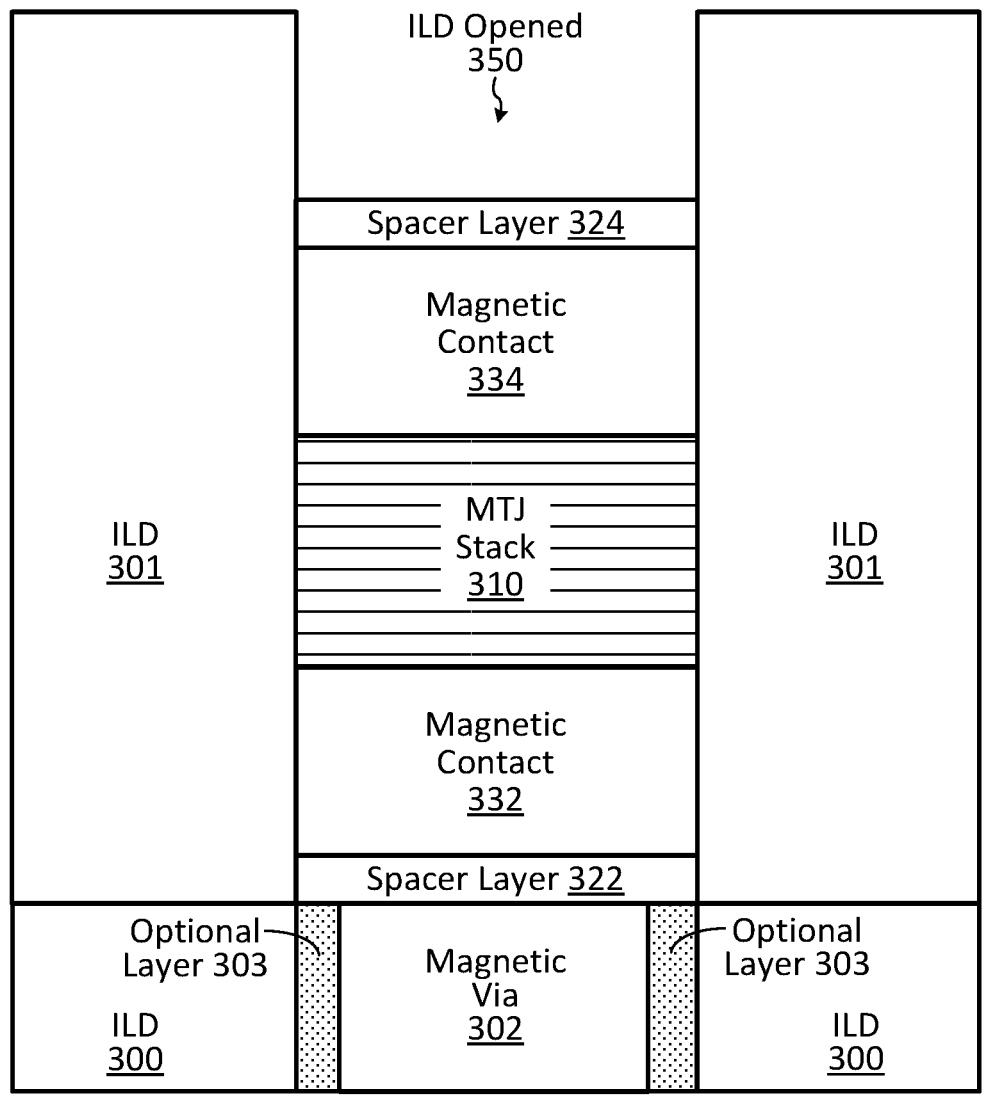

Method 200 continues with etching 214 ILD 301 to form/create an open space 350 for the upper via to be deposited, as shown in FIG. 3G, in accordance with an embodiment. Etch 214 may be performed using any suitable etching techniques and may include any number of suitable patterning processes.

Method 200 continues with depositing 216 the upper via material, in accordance with some embodiments. Deposition 216 may be performed using the example techniques described herein (e.g., PVD, CVD, ALD, MBE, etc.), or using any other suitable technique. For example, in the embodiment shown in FIG. 3H, the upper via material includes optional layer 305 and magnetic via layer 304 that were deposited 216 on the structure shown in FIG. 3G. However, the upper via may be a nonmagnetic material, as discussed herein with reference to, for example, the embodiment in FIG. 4. In the example embodiment shown in FIG. 3H, optional layer 305 was deposited and then etched to retain optional layer 305 only on the sides of open space 350 in ILD 301, and then magnetic via layer 304 was deposited thereon. However, since layer 305 is optional, the layer need not be present. As previously described, optional layer 305 may be formed to help the magnetic material (magnetic via 304 material, in this example case) to not diffuse into the surrounding ILD material (ILD 301, in this example case). Optional layer 305 may also be formed to help provide magnetic shielding to, for example, help shield the magnetic field of magnetic via 304 from neighboring structures.

Figure 3H:
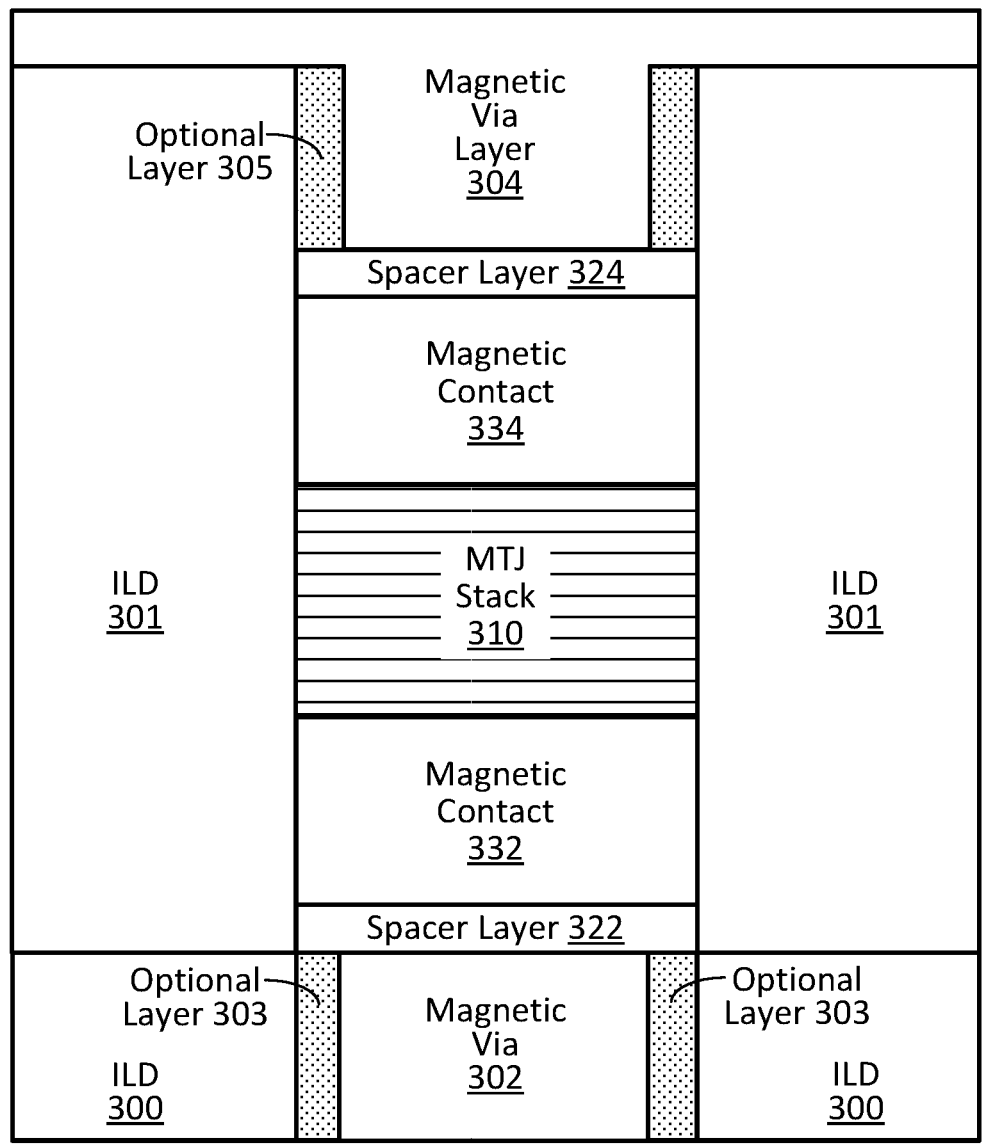
Figure 3I:
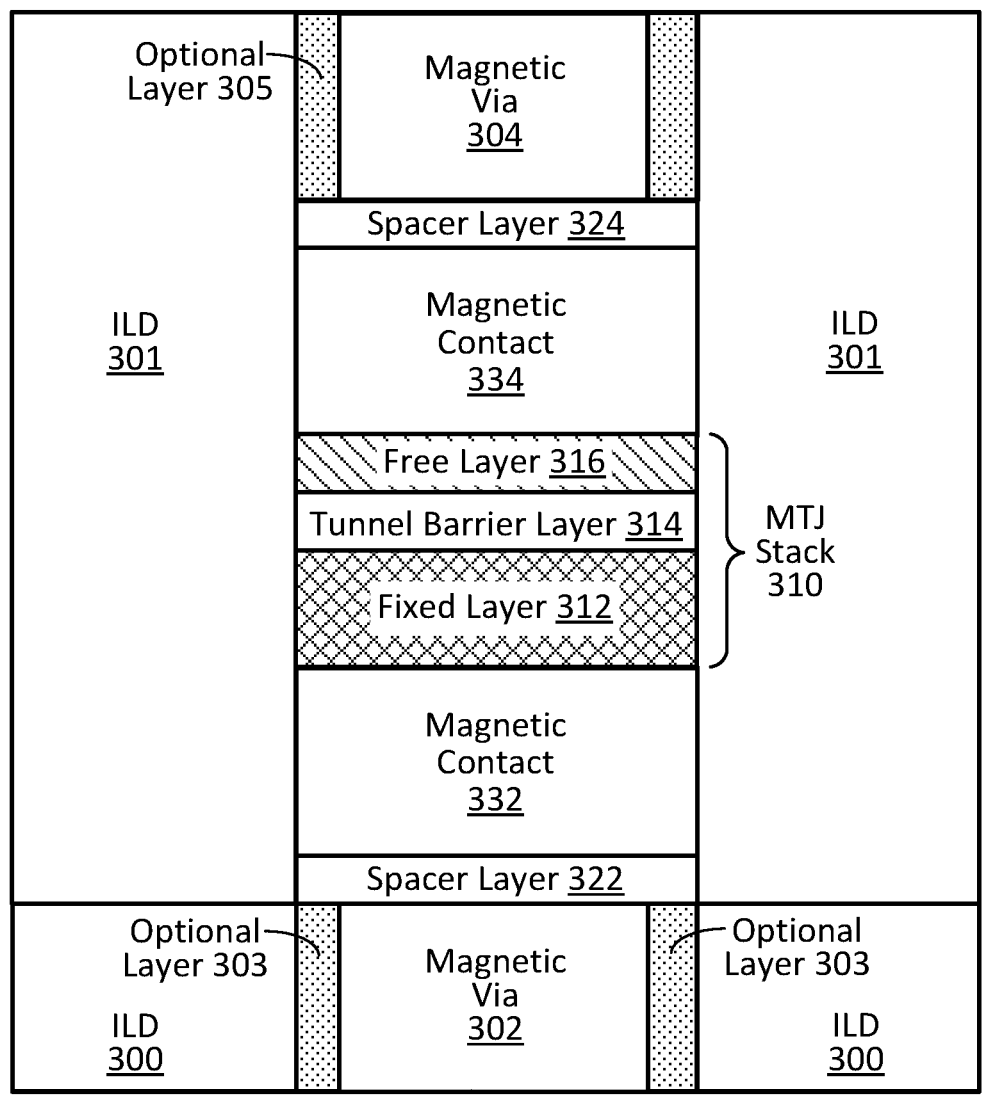

Method 200 continues with optionally planarizing and/or polishing 218 the structure of FIG. 3H to form the structure shown in FIG. 3I, in accordance with an embodiment. In this example embodiment, planarizing/polishing 218 was performed to remove the excess magnetic via 304 material (and any remaining optional layer 305 material) from on top of ILD 301. Planarizing/polishing can be performed using any suitable technique, such as chemical mechanical planarizing/polishing (CMP) or any other suitable process.

In an alternative embodiment, method 200 may include depositing the upper via material (e.g., magnetic via layer 304) on, for example, the structure shown in FIG. 3D (e.g., on top of spacer layer 324). In such an embodiment, the upper via layer could then be etched with the rest of the layers that were blanket deposited on the substrate to form a structure similar to that shown in FIG. 3E, except that the etched stack would include the upper via (e.g., magnetic via 304) on top. Further, in such an embodiment, ILD material could then be deposited over this structure and a portion of the ILD could be opened to gain access to the upper via to establish an electrical connection with the top of the MTJ stack, for example. Numerous other configurations and variations will be apparent in light of this disclosure.

Figure 3J:
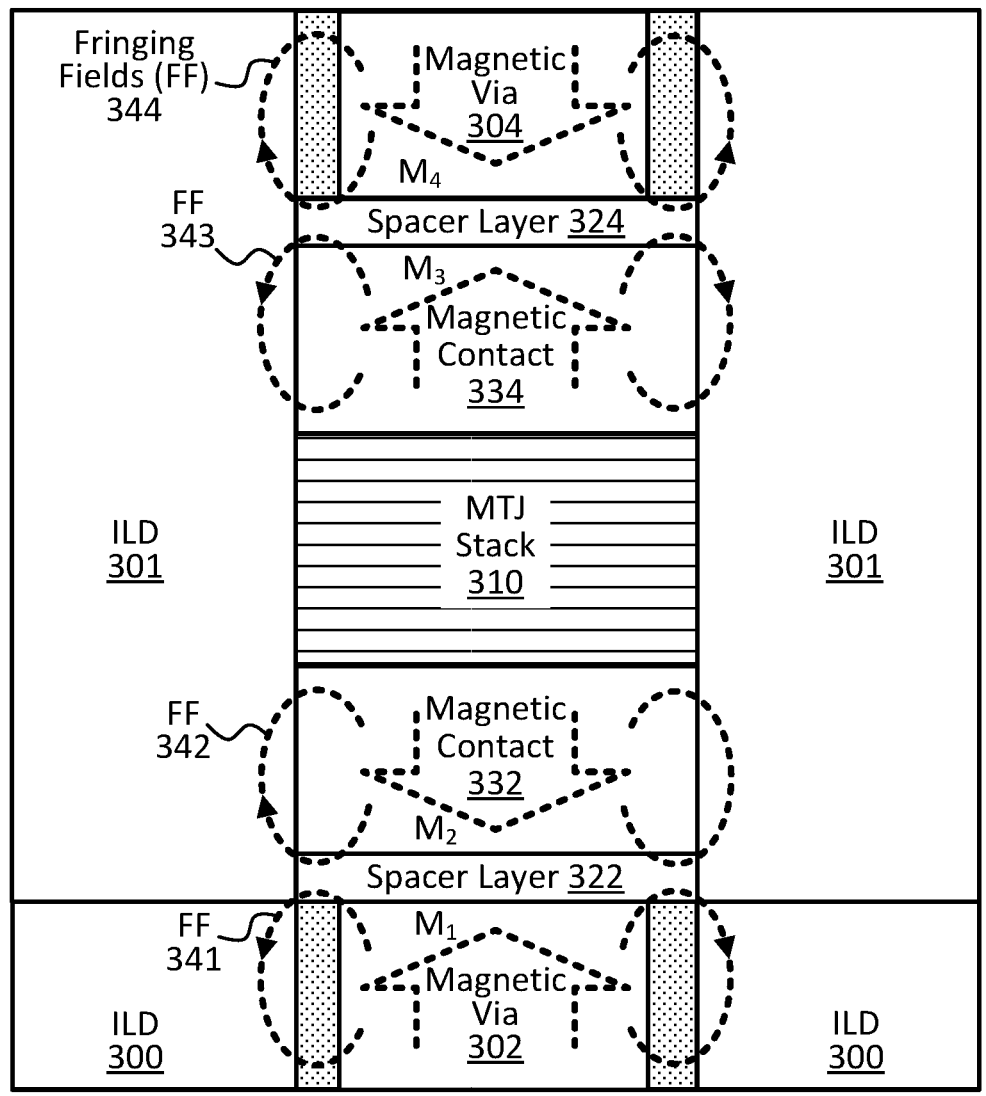
FIG. 3J illustrates the STTM device of FIG. 3I, showing moments of magnetization and fringing fields of the magnetic layers, in accordance with an embodiment.

FIG. 3J illustrates the STTM device of FIG. 3I, showing moments of magnetization and fringing fields of the magnetic layers, in accordance with an embodiment. As can be seen in the example embodiment of FIG. 3J, magnetic via 302 has magnetic moment $M_1$ and fringing fields 341, magnetic contact 332 has magnetic moment $M_2$ and fringing fields 342, magnetic contact 334 has magnetic moment $M_3$ and fringing fields 343, and magnetic via 304 has magnetic moment $M_4$ and fringing fields 344. For purposes of illustration, the magnetic moments of each magnetic layer are indicated by a dashed arrow, and the fringing fields are indicated by dashed ellipses including arrows that show the magnetic direction of the fringing fields. Further, spacer layer 322 antiferromagnetically couples magnetic via 302 with magnetic contact 332, and spacer layer 324 antiferromagnetically couples magnetic via 304 with magnetic contact 334. As can also be seen in this example embodiment, $M_1$ is antiparallel to and in-line with $M_2$, and $M_3$ is antiparallel to and in-line with $M_4$. Note that the magnetic moments are also in-line with MTJ stack 310. Also note that although the in-line magnetic moments of the coupled magnetic layers ($M_1/M_2$ and $M_3/M_4$, in this example case) are directed toward one another in this example embodiment, in another example embodiment, the in-line magnetic moments of coupled magnetic layers may be oriented to direct away from one another other. In some instances, the magnetic contacts may be similar or identical to the magnetic vias (e.g., similar or identical materials), except that the magnetic contacts may be aligned in an antiparallel orientation relative to the magnetic vias (such as is shown in FIG. 3J). In some embodiments, the magnetic moments of the magnetic via/magnetic contact combinations ($M_1/M_2$ and/or $M_3/M_4$, in this example case) may be substantially antiparallel to help reduce the effects of their respective fringing fields. Therefore, in some embodiments, the magnetic moments need not be exactly antiparallel or perfectly antiferromagnetically coupled (e.g., the magnetic moments may have at least a nearly balanced antiferromagnetic coupling) to help limit or completely reduce the parasitic fringing fields of the magnetic layers.

As can be seen in FIG. 3J, fringing fields 341, 344 of magnetic vias 302, 304, respectively, do not encroach on MTJ stack 310, because the magnetic fields of magnetic vias 302, 304 are being balanced by magnetic contacts 332, 334, respectively. Note that fringing fields 341, 344 can be compared to fringing field 140 in FIG. 1B to see the difference in fringing field locations relative to the MTJ stacks. Also note that fringing fields 342, 343 of magnetic contacts 332, 334 do not encroach on MTJ stack 310, in this example embodiment, because the magnetic fields of magnetic contacts 332, 334 are being balanced by magnetic vias 302, 304, respectively. Therefore, coupling an additional magnetic layer antiferromagnetically (or in a substantially antiparallel manner) with a magnetic via/contact layer helps to limit the parasitic fringing fields. In some embodiments, substantially antiparallel may mean within 5, 10, 15, 20, 25, or 30 degrees of exactly antiparallel, or within some other suitable degree amount as will be apparent in light of this disclosure.

The magnetic layers in FIG. 3J are configured, in this example embodiment, such that the 302/322/332 and 304/322/332 layer stacks each form synthetic antiferromagnetic (SAF) contacts to MTJ stack 310. In other words, each magnetic via/spacer layer/magnetic contact stack forms an SAF contact to MTJ stack 310, in this example embodiment. In some embodiments, the magnetic via/spacer layer/magnetic contact stacks may comprise Co/Ru/Co, Co/Ru/CoFeB, CoFeB/Ru/CoFeB, CoFeB/Ru/Co, or some other suitable combination as will be apparent in light of this disclosure. The dimensions (e.g., thickness, depth, etc.) of the layers may be adjusted based on the materials used and the given target application or end use.

Figure 4:
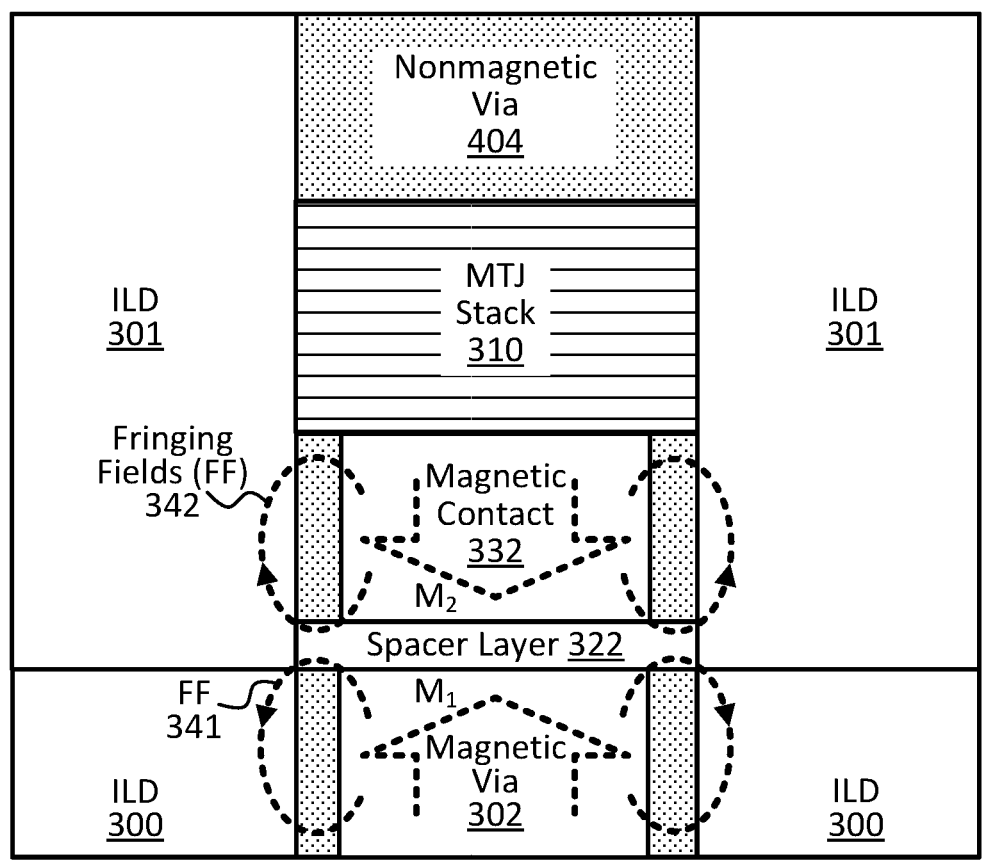
FIG. 4 illustrates an example STTM device including one magnetic contact and one nonmagnetic contact, in accordance with an embodiment.

FIG. 4 illustrates an example STTM device including one magnetic contact and one nonmagnetic contact, in accordance with an embodiment. The structure shown in FIG. 4 is similar to the structure shown in FIG. 3J, except that the upper contact is an SAF contact in FIG. 3J and a nonmagnetic material in FIG. 4. As can be seen, FIG. 4 includes an upper nonmagnetic via/contact 404. For example, such a structure may be formed using method 200 of FIG. 2, where optional deposition 208 is not performed and deposition 216 of the upper via material is a deposition of a nonmagnetic material, in accordance with an embodiment. This structure is provided to illustrate that both contacts need not be magnetic materials that are antiferromagnetically coupled (or coupled in a substantially antiparallel manner), as variously described herein. In such embodiments, the upper or lower via/contact may be a nonmagnetic material (shown as the upper via/contact 404, in this example case). For example, nonmagnetic via 404 may comprise copper (Cu) or some other nonmagnetic material. Further, the nonmagnetic via/contact may be electrically connected to the fixed layer or the free layer of the MTJ stack (e.g., fixed layer 312 or free layer 316 of MTJ stack 310), or to some other layer(s) of any other suitable MTJ stack as variously described herein.

Figure 5:
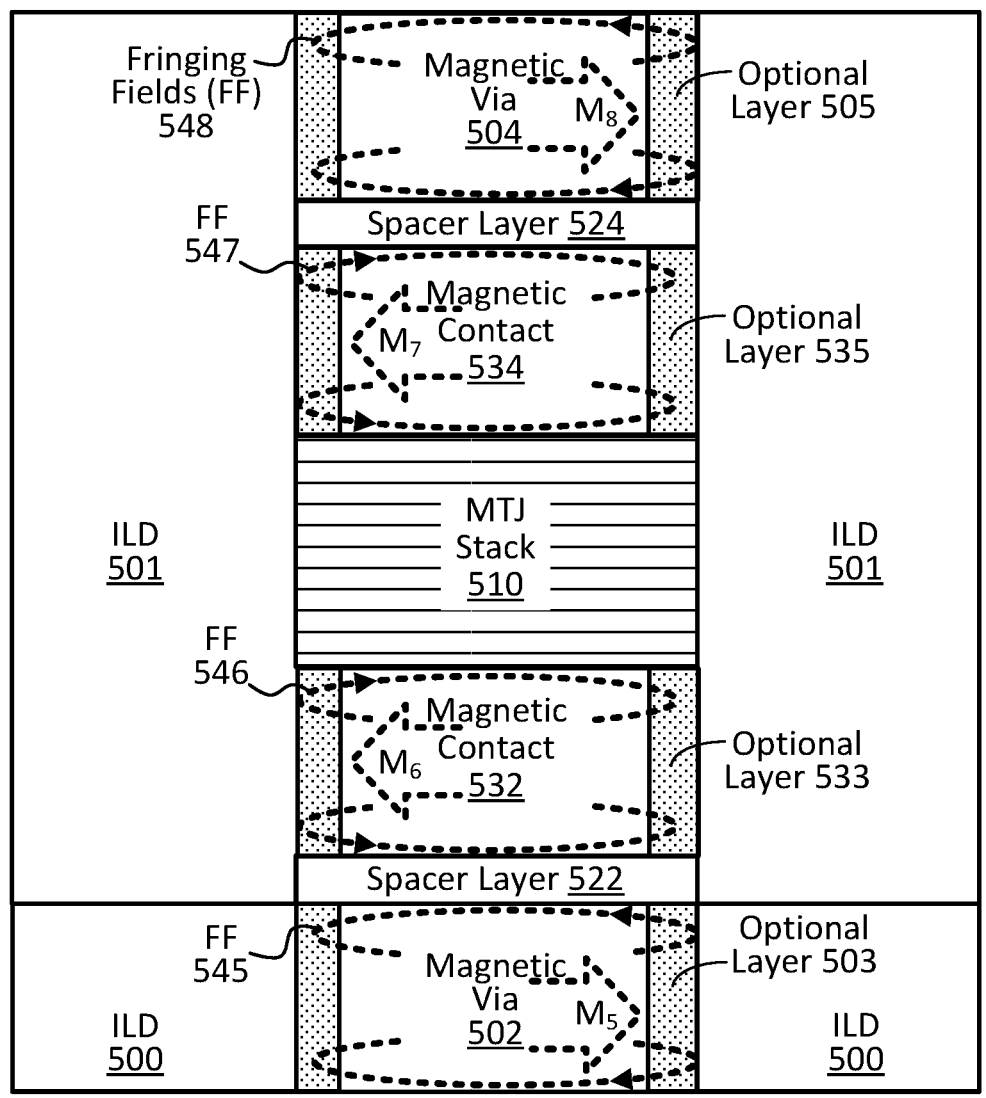
FIG. 5 illustrates an example STTM device including magnetic contacts having in-plane magnetic moments, in accordance with an embodiment.

FIG. 5 illustrates an example STTM device including magnetic contacts having in-plane magnetic moments, in accordance with an embodiment. The structure shown in FIG. 5 is similar to the structure shown in FIG. 3J, and thus similar numbering is used to describe the components of the structure, where the components are numbered in the 300s in FIG. 3J and in the 500s in FIG. 5 (e.g., ILD 300 is similar to ILD 500, MTJ stack 310 is similar to MTJ stack 510, and so on). Therefore, discussion of the elements provided herein is applicable to the elements in FIG. 5. A difference between the structures in FIG. 5 and FIG. 3J is that the magnetic moments $M_{5-8}$ of the magnetic layers in FIG. 5 are in-plane (e.g., in-plane with one another and in-plane with MTJ stack 510), as compared to the magnetic moments $M_{1-4}$ of the magnetic layers in FIG. 3J, which are in-line (e.g., in-line with one another and in-line with MTJ stack 310).

As can be seen in the example embodiment of FIG. 5, magnetic via 502 has magnetic moment $M_5$ and fringing fields 545, magnetic contact 532 has magnetic moment $M_6$ and fringing fields 346, magnetic contact 534 has magnetic moment $M_7$ and fringing fields 347, and magnetic via 504 has magnetic moment $M_8$ and fringing fields 348. For purposes of illustration, the magnetic moments of each magnetic layer are indicated by a dashed arrow, and the fringing fields are indicated by dashed ellipses including arrows that show the magnetic direction of the fringing fields. Further, spacer layer 522 antiferromagnetically couples magnetic via 502 with magnetic contact 532, and spacer layer 524 antiferromagnetically couples magnetic via 504 with magnetic contact 534. As can also be seen in this example embodiment, $M_5$ is antiparallel to and in-plane with $M_6$, and $M_7$ is antiparallel to and in-plane with $M_8$. As described herein, although the magnetic moments of the magnetic via/magnetic contact combinations ($M_5/M_6$ and $M_7/M_8$, in this example case) are exactly antiparallel to effect SAF coupling, they need not be exactly antiparallel or perfectly antiferromagnetically coupled (e.g., the magnetic moments may have at least a nearly balanced antiferromagnetic coupling) to help limit or completely reduce the parasitic fringing fields of the magnetic layers. In such cases where the magnetic moments of the magnetic layers are in-plane (e.g., as shown in FIG. 5), antiferromagnetically coupling each magnetic layer with another (or coupling them in a substantially antiparallel manner) can help limit the fringing fields from negatively affecting nearby devices.

Another difference between FIG. 5 and FIG. 3J is that the magnetic layers in FIG. 5 (i.e., magnetic vias 502, 504 and magnetic contacts 532, 534) all have optional layers (i.e., optional layers 503, 505, 533, 535, respectively) on either side of each magnetic layer. As described herein, the optional layers may be on either side (or on multiple sides)

of any, all, or none of the magnetic layers and they may provide benefits such as, for example, helping to prevent the magnetic materials from diffusing into the ILD materials and/or providing a barrier to surrounding materials (e.g., providing magnetic shielding).

Example System

Figure 6:
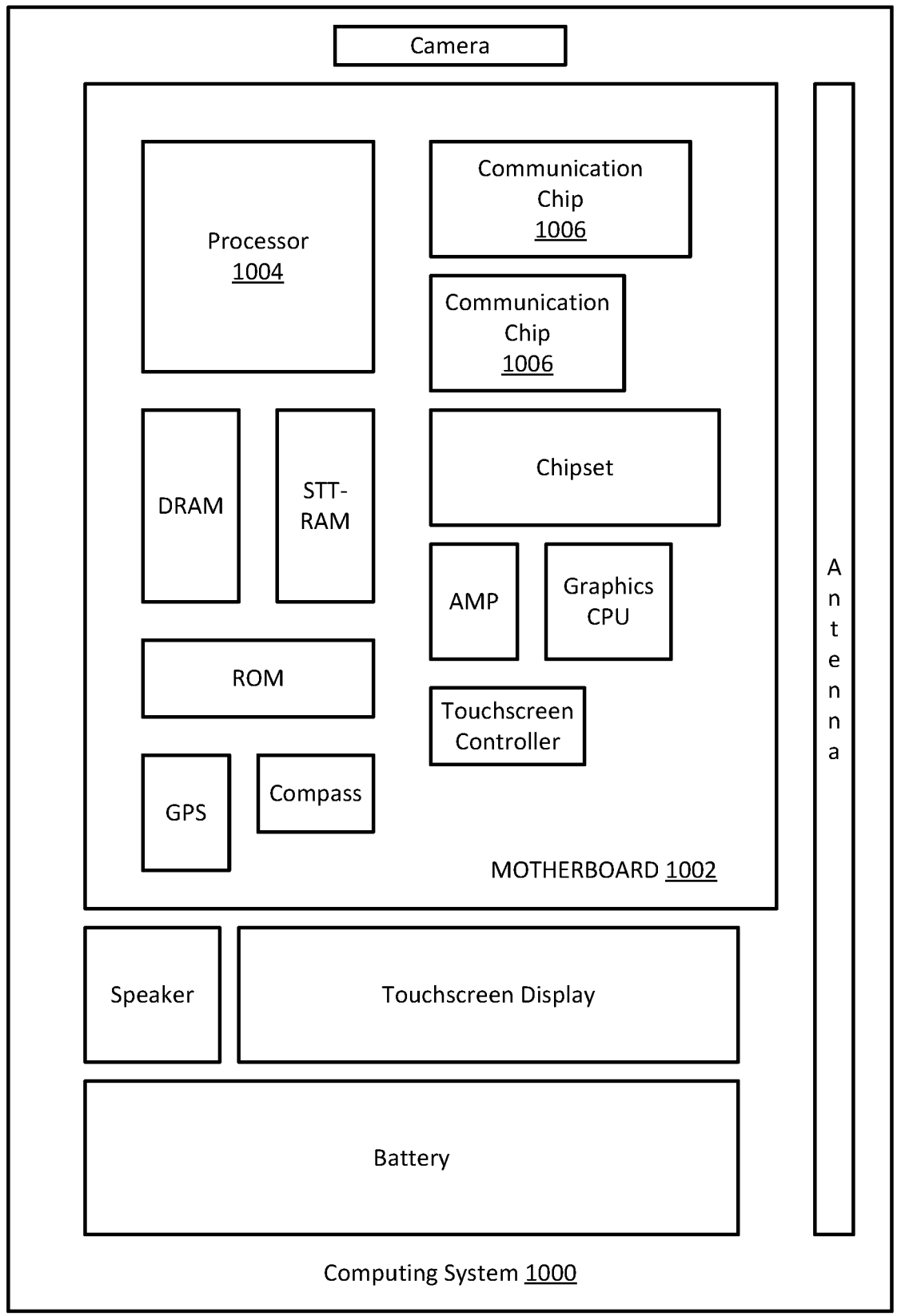
FIG. 6 illustrates a computing system implemented with integrated circuit structures or devices (e.g., STTM devices) formed using the techniques and/or structures disclosed herein, in accordance with various example embodiments.

FIG. 6 illustrates a computing system 1000 implemented with integrated circuit structures or devices (e.g., spin-transfer torque memory (STTM) devices) formed using the techniques disclosed herein, in accordance with various example embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM, STTM, STT-RAM, etc.), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. For example, in some embodiments, one or more of the components of computing system may comprise STTM including one or more SAF contacts, as variously described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a spin-transfer torque memory (STTM) device including: a magnetic tunnel junction (MTJ) including a fixed magnetic layer, a free magnetic layer, and a tunneling barrier layer disposed between the fixed and free magnetic layers; contacts on either side of the MTJ, wherein at least one contact is magnetic; and an additional magnetic layer antiferromagnetically coupled to the at least one magnetic contact.

Example 2 includes the subject matter of Example 1, wherein the at least one magnetic contact and/or corresponding additional magnetic layer includes at least one ferromagnetic material.

Example 3 includes the subject matter of any of Examples 1-2, wherein the at least one magnetic contact and/or corresponding additional magnetic layer includes CoFeB.

Example 4 includes the subject matter of any of Examples 1-3, wherein a nonmagnetic spacer layer is disposed between each magnetic contact and corresponding additional magnetic layer.

Example 5 includes the subject matter of Example 4, wherein each nonmagnetic spacer layer has a thickness between 0.7 and 1.0 nm.

Example 6 includes the subject matter of any of Examples 4-5, wherein each nonmagnetic spacer layer includes ruthenium (Ru).

Example 7 includes the subject matter of any of Examples 1-6, wherein each magnetic contact and corresponding additional magnetic layer have in-line magnetic moments.

Example 8 includes the subject matter of any of Examples 1-6, wherein each magnetic contact and corresponding additional magnetic layer have in-plane magnetic moments.

Example 9 includes the subject matter of any of Examples 1-8, further including a nonmagnetic cladding layer on either side of the at least one magnetic contact and/or corresponding additional magnetic layer, wherein the nonmagnetic cladding layer helps prevent magnetic material from diffusing into surrounding material.

Example 10 includes the subject matter of Example 9, wherein the nonmagnetic cladding layer includes titanium nitride (TiN) or tantalum (Ta).

Example 11 includes the subject matter of any of Examples 9-10, wherein the nonmagnetic cladding layer has a thickness ranging from 2-10 nm.

Example 12 includes the subject matter of any of Examples 1-11, wherein both contacts are magnetic and antiferromagnetically coupled to a corresponding additional magnetic layer.

Example 13 includes the subject matter of any of Examples 1-12, wherein each additional magnetic layer helps prevent fringing fields from the corresponding magnetic contact from encroaching on the MTJ.

Example 14 is a computing system including the subject matter of any of Examples 1-13.

Example 15 is an integrated circuit including: a magnetic tunnel junction (MTJ) including a fixed magnetic layer, a free magnetic layer, and a tunneling barrier layer disposed between the fixed and free magnetic layers; a magnetic contact layer electrically connected to at least one side of the MTJ; and an additional magnetic layer separated from the magnetic contact layer by a spacer layer; wherein the magnetic moments of the magnetic contact layer and the additional magnetic layer are substantially antiparallel.

Example 16 includes the subject matter of Example 15, wherein the magnetic contact layer and/or additional magnetic layer comprise at least one ferromagnetic material.

Example 17 includes the subject matter of any of Examples 15-16, wherein the magnetic contact layer and/or additional magnetic layer comprise CoFeB.

Example 18 includes the subject matter of any of Examples 15-17, wherein the spacer layers has a thickness between 0.7 and 1.0 nm.

Example 19 includes the subject matter of any of Examples 15-18, wherein the spacer layer includes a nonmagnetic material.

Example 20 includes the subject matter of any of Examples 15-19, wherein the spacer layer includes ruthenium (Ru).

Example 21 includes the subject matter of any of Examples 15-20, wherein the magnetic moments of the magnetic contact layer and the additional magnetic layer are substantially in-line.

Example 22 includes the subject matter of any of Examples 15-20, wherein the magnetic moments of the magnetic contact layer and the additional magnetic layer are substantially in-plane.

Example 23 includes the subject matter of any of Examples 15-22, further including a nonmagnetic cladding layer on either side of the magnetic contact layer and/or the additional magnetic layer, wherein the nonmagnetic cladding layer helps prevent magnetic material from diffusing into surrounding material.

Example 24 includes the subject matter of Example 23, wherein the nonmagnetic cladding layer includes titanium nitride (TiN) or tantalum (Ta).

Example 25 includes the subject matter of any of Examples 23-24, wherein the nonmagnetic cladding layer has a thickness ranging from 2-10 nm.

Example 26 includes the subject matter of any of Examples 15-25, wherein the magnetic contact layer and the additional magnetic layer create a synthetic antiferromagnet (SAF).

Example 27 includes the subject matter of any of Examples 15-26, wherein the additional magnetic layer helps prevent fringing fields from the magnetic contact layer from encroaching on the MTJ.

Example 28 is an embedded memory device including the subject matter of any of Examples 15-27.

Example 29 includes the subject matter of Example 28, wherein the embedded memory device is a spin-torque transfer memory (STTM) device.

Example 30 is a method of forming a spin-transfer torque memory (STTM) device, the method including: providing a substrate including a magnetic lower via; and forming a multilayer stack on the substrate, the stack including a spacer layer, a magnetic contact layer, magnetic tunnel junction (MTJ) layers, and an upper via layer.

Example 31 includes the subject matter of Example 30, wherein the MTJ layers comprise a fixed magnetic layer, a free magnetic layer, and a tunneling barrier layer.

Example 32 includes the subject matter of any of Examples 30-31, wherein the stack has a width similar to the magnetic lower via width.

Example 33 includes the subject matter of any of Examples 30-32, wherein the upper via material is nonmagnetic.

Example 34 includes the subject matter of any of Examples 30-32, further including: forming an additional magnetic contact layer on the MTJ layers; and forming a spacer layer between the additional magnetic contact layer and the upper via layer.

Example 35 includes the subject matter of Example 34, wherein the upper via material is ferromagnetic.

Example 36 includes the subject matter of any of Examples 30-35, wherein each magnetic contact layer is antiferromagnetically coupled with a corresponding magnetic via.

Example 37 includes the subject matter of any of Examples 30-36, wherein the multilayer stack is formed by: depositing, on the substrate, all of the layers that comprise the stack; and etching all of the layers that comprise the stack to a desired width.

Example 38 includes the subject matter of any of Examples 30-33, wherein the multilayer stack is formed by: depositing the spacer layer, magnetic contact layer, and MTJ layers on the substrate; etching the deposited spacer layer, magnetic contact layer, and MTJ layers to a desired width; depositing interlayer dielectric (ILD) material; etching the ILD to create space above the MTJ layers; and forming the upper via layer in the space above the MTJ layers.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit, comprising:
   a magnetic tunnel junction (MTJ) structure having a first surface and a second surface;
   a contact on the first surface of the MTJ structure and/or a contact on the second surface of the MTJ structure, wherein at least one of the contacts is magnetic; and
   an additional magnetic layer antiferromagnetically coupled to the contact on the first surface of the MTJ structure and/or an additional magnetic layer antiferromagnetically coupled to the contact on the second surface of the MTJ structure.

2. The integrated circuit of claim 1, wherein the integrated circuit is part of a memory structure.

3. The integrated circuit of claim 2, wherein the memory structure is a spin-torque transfer memory (STTM) device or a magnetoresistive random-access memory (MRAM) device.

4. The integrated circuit of claim 2, wherein the memory structure is part of a processor.

5. The integrated circuit of claim 1, further comprising a first bit line connected to the additional magnetic layer coupled to the contact on the first surface and/or a second bit line connected to the additional magnetic layer coupled to the contact on the second surface.

6. The integrated circuit of claim 1, wherein a nonmagnetic spacer layer is between one or both of the contact on the first surface and the corresponding additional magnetic layer and the contact on the second surface and the corresponding additional magnetic layer.

7. The integrated circuit of claim 6, wherein the nonmagnetic spacer layer has a thickness between 0.5 and 1.5 nm, and each nonmagnetic spacer layer includes one or more of ruthenium, osmium, rhenium, chromium, rhodium, copper, niobium, molybdenum, tungsten, iridium, vanadium, or alloys thereof.

8. The integrated circuit of claim 6, the MTJ structure, the one or both contacts, and the one or both additional layers each have sidewalls, the integrated circuit further comprising insulator material laterally adjacent to the sidewalls.

9. The integrated circuit of claim 1, wherein magnetic moments of the contact on the first surface and/or the contact on the second surface and a corresponding one of the additional magnetic layers are within 30° of antiparallel to one another.

10. An integrated circuit, comprising:
    a magnetic tunnel junction (MTJ) structure having a top surface and a bottom surface;
    a contact on the top surface of the MTJ structure and/or a contact on the bottom surface of the MTJ structure, wherein at least one of the contacts is magnetic; and
    an additional magnetic layer antiferromagnetically coupled to the contact on the top surface of the MTJ structure and/or an additional magnetic layer antiferromagnetically coupled to the contact on the bottom surface of the MTJ structure.

11. The integrated circuit of claim 10, further comprising:
    a layer comprising non-magnetic material, the layer being between a corresponding one of the contacts and a corresponding one of the additional magnetic layers; and
    insulator material laterally adjacent to at least sidewalls of the MTJ structure and the layer.

12. An integrated circuit comprising:
    a magnetic tunnel junction (MTJ) structure;
    a first contact on a first side of the MTJ structure and a second contact on a second side of the MTJ structure opposite the first side, wherein at least one contact is magnetic;
    a first spacer layer adjacent a side of the first contact opposite the MTJ structure; and
    a second spacer layer adjacent a side of the second contact opposite the MTJ structure.

13. The integrated circuit of claim 12, wherein one or both of the first spacer layer and the second spacer layer have a thickness between 0.5 and 1.5 nanometers (nm).

14. The integrated circuit of claim 12, wherein the first spacer layer and the second spacer layer include ruthenium, osmium, rhenium, chromium, rhodium, copper, niobium, molybdenum, tungsten, iridium, vanadium, or alloys thereof.

15. The integrated circuit of claim 12, further comprising:
    a first additional magnetic layer adjacent the first spacer layer, wherein the first spacer layer is between the first additional magnetic layer and the first contact; and
    a second additional magnetic layer adjacent the second spacer layer, wherein the second spacer layer is between the second additional magnetic layer and the second contact.

16. The integrated circuit of claim 15, wherein magnetic moments of the first contact and the first additional magnetic layer are within 30° of antiparallel to one another.

17. The integrated circuit of claim 15, wherein:
    the first contact and the first additional magnetic layer are, collectively, a first synthetic antiferromagnet (SAF); and
    the second contact and the second additional magnetic layer are, collectively, a second synthetic antiferromagnet (SAF).

18. The integrated circuit of claim 15, further comprising a bit line connected to at least one of the first additional magnetic layer or the second additional magnetic layer.

19. An embedded memory device comprising the integrated circuit of claim 12.

20. The embedded memory device of claim 19, wherein the embedded memory device is a spin-torque transfer memory (STTM) device.

* * * * *